United States Patent
Insler

(10) Patent No.: US 9,553,679 B2
(45) Date of Patent: Jan. 24, 2017

(54) ANALOG RADIO FREQUENCY MEMORY FOR SIGNAL REPLICATION

(71) Applicant: BAE Systems Information and Electronic Systems Integration Inc., Nashua, NH (US)

(72) Inventor: Julius Insler, Bergenfield, NJ (US)

(73) Assignee: BAE Systems Information and Electronic Systems Integrations Inc., Nashua, NH (US)

( * ) Notice: Subject to any disclaimer, the term of this patent is extended or adjusted under 35 U.S.C. 154(b) by 290 days.

(21) Appl. No.: 14/337,630

(22) Filed: Jul. 22, 2014

(65) Prior Publication Data
US 2015/0031285 A1      Jan. 29, 2015

Related U.S. Application Data

(60) Provisional application No. 61/857,713, filed on Jul. 24, 2013.

(51) Int. Cl.
*H04B 10/90*     (2013.01)
*G11C 27/02*     (2006.01)

(52) U.S. Cl.
CPC ............. *H04B 10/90* (2013.01); *G11C 27/026* (2013.01); *H04B 2210/006* (2013.01)

(58) Field of Classification Search
CPC combination set(s) only.
See application file for complete search history.

(56) References Cited

U.S. PATENT DOCUMENTS

| 4,580,168 | A |   | 4/1986 | Levine |              |
|-----------|---|---|--------|--------|--------------|
| 4,644,572 | A | * | 2/1987 | Lambeth | G11C 19/285 |
|           |   |   |        |        | 257/216      |
| 4,648,072 | A | * | 3/1987 | Hayes  | G01R 13/345  |
|           |   |   |        |        | 365/45       |
| 4,811,371 | A |   | 3/1989 | Tower  |              |
| 5,017,924 | A | * | 5/1991 | Guiberteau | G11C 27/026 |
|           |   |   |        |        | 327/94       |
| 5,287,070 | A |   | 2/1994 | Thelen et al. |       |
| 5,557,641 | A | * | 9/1996 | Weinberg | H04L 27/20 |
|           |   |   |        |        | 375/295      |
| 5,592,309 | A | * | 1/1997 | Nagler | H04N 1/02815 |
|           |   |   |        |        | 358/482      |
| 5,726,794 | A | * | 3/1998 | Tajima | G02F 1/0123  |
|           |   |   |        |        | 330/97       |

(Continued)

OTHER PUBLICATIONS

Carnes, J. E., W. F. Kosonocky, J. M. Chambers, and D. J. Sauer. "Charge-coupled devices for computer memories." In Proceedings of the May 6-10, 1974, national computer conference and exposition, pp. 827-836. ACM, 1974.*

(Continued)

*Primary Examiner* — Yuwen Pan
*Assistant Examiner* — Zhitong Chen
(74) *Attorney, Agent, or Firm* — Finch & Maloney, PLLC; Daniel J. Long

(57) ABSTRACT

A method and system for processing a signal in the RF environment is disclosed. The method includes using an Analog Radio Frequency Memory (ARFM) to store an analog amplitude representation of the signal in the form of elemental charge packets. The stored signal is played back by converting the elemental charge packets back to their representative voltages to rejuvenate the original signal.

18 Claims, 11 Drawing Sheets

(56) References Cited

U.S. PATENT DOCUMENTS

| | | | |
|---|---|---|---|
| 5,923,061 A | 7/1999 | Linnenbrink et al. | |
| 2007/0237194 A1* | 10/2007 | Shahine | H01S 5/06832 372/29.011 |

OTHER PUBLICATIONS

Paul, Susanne A., and Hae-Seung Lee. "A 9-b charge-to-digital converter for integrated image sensors." Solid-State Circuits, IEEE Journal of 31, No. 12 (1996): 1931-1938.*
C. Carrison and N. A. Foss. "Performance Characteristics of a CCD Analog Memory/Processor". Proceedings of the 5th International Conference on Charge-Coupled Devices University of Edinburgh, 1979 pp. 156-161.*
Prigozhin et al., CCD Charge Injection Structure at Very Small Signal Levels, IEEE Transactions on Electron Devices, Aug. 2008, p. 2111-2120, vol. 55, No. 8, IEEE Journals & Magazines, United States.
Inphi Proprietary, 1821TH 18 GHz Bandwidth 2 GS/s THA Datasheet, 1821TH_DS_Ver1.5, Jun. 2, 2009, p. 1-22, Inphi Corporation, United States.
Yamashita et al., A 2/3-in 2 Million Pixel STACK-CCD HDTV Imager, IEEE Journal of Solid-State Circuits, Aug. 1995, p. 881-889, vol. 30, No. 8, IEEE Journals & Magazines, United States.
Cooper, CCD Problems, A Darker View, http://darkerview.com/CCDProblems/CCDProblems.php.
McCaughan et al., A novel C.C.D. multiplying input technique, Electronics Letters, Mar. 16, 1978, p. 165-166, vol. 14, Institution of Engineering and Technology.
University of Oregon, Evolving Towards the Perfect CCD, CCDs for Material Scientists, 1994, p. 1-14, United States.
Paul et al., A 9-b Charge-to-Digital Converter for Integrated Image Sensors, IEEE Journal of Solid-State Circuits, Dec. 1996, p. 1931-1938, vol. 31, No. 12, IEEE Journals & Magazines, United States.
Wikipedia Contributors, Charge-coupled device, http://en.wikipedia.org/w/index.php?title=Charge-coupled_device&oldid=629481574, Wikipedia, The Free Encyclopedia.
Thingsrud, DRFM-Modulator for HRR-Jamming, RTO SET Symposium on "Target Identification and Recognition Using RF Systems" Oct. 2004, p. 7-1-p. 7-12, RTO-MP-SET-080.
Apogee Imaging Systems, Dynamic Range, CCD University, http://www.ccd.com/ccdu.html, Apogee Imaging Systems, Roseville, California.
Karkhaneh et al., Compensating the Nonlinearity of Laser Diode in Optical wireless Transmission Using OFDM, 9th WSEAS International Conference on Data Networks,Communications, Computers, Nov. 2010, p. 92-96, ISSN: 1792-6157, WSEAS Press.
Abramowitz et al., Concepts in Digital Imaging Technology—Two Phase CCD Clocking, Molecular Expressions Optical Microscopy Primer Digital Imaging in Optical Microscopy, http://micro.magnet.fsu.edu/primer/digitalimaging/ concepts/twophase.html, Florida State University.
Abramowitz et al., Concepts in Digital Imaging Technology—Four Phase CCD Clocking, Molecular Expressions Optical Microscopy Primer Digital Imaging in Optical Microscopy, http://micro.magnet.fsu.edu/primer/digitalimaging/concepts/fourphase.html, Florida State University.
Seeds et al., Optical Control of Microwave Semiconductor Devices, IEEE Transactions on Microwave Theory and Techniques, May 1990, p. 577-585, vol. 38, No. 5, IEEE Journals & Magazines, United States.
Chihara et al., An Application of Photoconductive Switch for High-Speed Testing, International Test Conference, Oct. 1996, Paper 25. 1 p. 669-676, http://dx.doi.org/10.1109/TEST.1996.557124, IEEE Conference Publications.
Morse et al., Picosecond Optoelectronic Gating of Silicon Bipolar Transistors by Locally Integrated GaAs Photoconductive Devices, IEEE Electron Device Letters, Jul. 1991, p. 379-381, vol. 12, No. 7, IEEE Journals & Magazines, United States.
Wikipedia Contributors, Potential well, http://en.wikipedia.org/wiki/Potential_well, Wikipedia, The Free Encyclopedia.
Tompsett, Surface Potential Equilibration Method of Setting Charge in Charge-Coupled Devices, IEEE Transactions on Electron Devices, Jun. 1975, p. 305-309, vol. ED-22, No. 6, IEEE Journals & Magazines, United States.
Matsumoto, STM/AFM Nano-Oxidation Process to Room-Temperature-Operated Single-Electron Transistor and Other Devices, Proceedings of the IEEE, Apr. 1997, p. 612-628, vol. 85, No. 4, IEEE Journals & Magazines, United States.
Lattes et al., Ultrafast Shallow-Buried-Channel CCD's with Built-in Drift Fields, IEEE Electron Device Letters, Mar. 1991, p. 104-107, vol. 12, No. 3, IEEE Journals & Magazines, United States.
Matsumoto, Application of Scanning Tunneling/Atomic Force Microscope Nano-Oxidation Process to Room Temperature Operated Single Electron Transistor and Other Devices, Scanning Electron Microscopy, 1998, p. 61-69, vol. 12, No. 1, Scanning Electron Microscopy, Inc., Chicago, IL.
Berglund et al., Novel Miniaturized Radar CM System, FOI, Dept. of EW Systems, FOI, Dept. of Sensor Technology, Sweden.
Yokoyama, Charge Transports and Terahertz Radiations, CLEO/Pacific Rim Conference Series, p. 76.
Itatani et al., Ultrafast photoconductive switch with a 43 nm insulator gap fabricated by an atomic force microscope, CLEO/Pacific Rim Conference Series, p. 134-135, 1997.
Itatani et al., Ultrafast photoconductive switches on a thin absorption layer fabricated by using an atomic force microscope, CLEO/Pacific Rim Conference Series, p. 160-161, 1999.
Mobarhan, Faster photodiodes meet variety of applications, Laser Focus World, Aug. 1999, PennWell.

* cited by examiner

FIG. 3

| Input Switch Selector | | CCD charge well | | | | | | | | | | | | | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| Switch Enabled | 1 | 0.1 | | | | | | | | | | | | | | | |
| | 2 | | | | | | | | | | | | | | | | |
| | 3 | | | | | | | | | | | | | | | | |
| | 4 | | | | | | | | | | | | | | | | |

FIG. 4

| Input Switch Selector | | CCD charge well | | | | | | | | | | | | | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| | 1 | | | 0.2 | 0.8 | | | 0.2 | 0.8 | | | 0.2 | 0.8 | | | 0.2 | 0.8 |
| | 2 | | 0.2 | 0.8 | | | 0.2 | 0.8 | | | 0.2 | 0.8 | | | 0.2 | 0.8 | |
| | 3 | 0.2 | 0.8 | | | 0.2 | 0.8 | | | 0.2 | 0.8 | | | 0.2 | 0.8 | | |
| Switch Enabled | 4 | 0.8 | | | 0.2 | 0.8 | | | 0.2 | 0.8 | | | 0.2 | 0.8 | | | | |

FIG. 5

| Input Switch Selector | | CCD charge well | | | | | | | | | | | | | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| Switch Enabled | 1 | | | 0 | 1 | | | 0 | 1 | | | 0 | 1 | | | 0 | 1 |
| | 2 | | 0 | 1 | | | 0 | 1 | | | 0 | 1 | | | 0 | 1 | |
| | 3 | 0 | 1 | | | 0 | 1 | | | 0 | 1 | | | 0 | 1 | | |
| | 4 | 1 | | | 0 | 1 | | | 0 | 1 | | | 0 | 1 | | | |

ANALOG RADIO FREQUENCY MEMORY FOR SIGNAL REPLICATION

RELATED APPLICATIONS

This Application claims rights under 35 USC §119(e) from U.S. Application Ser. No. 61/857,713 filed Jul. 24, 2013, the contents of which are incorporated herein by reference.

FIELD OF DISCLOSURE

This disclosure relates to analog radiofrequency memories and more particularly to the utilization of a charge-coupled device to serve as the memory.

BACKGROUND OF THE DISCLOSURE

It is often necessary to have the ability to store an exact replica on of an incoming RF signal to be able to replay and utilize it in the future. Unlike tape recorders and other types of recording devices in which audio or text is stored, it is only with great difficulty that one can obtain an incoming RF signal and duplicate it at a time convenient to the user.

In the past, various approaches been utilized to capture incoming signals and generate a replica signal modulated in such a way as to provide a countermeasure, to for instance countermeasure incoming threat missiles. These systems include an RF memory loop based on piezoelectric delay lines, fiber optic delay lines; magnetostrictive delay lines, inductive delay lines composed of strings of inductors and capacitors (Ladder Topology), and traveling wave tube delay lines. There were noted limitations with these approaches starting with the fidelity of the captured signal and eventual loss of signal quality following several passes or recirculation cycles. However, all of these approaches have become impractical and in their place a digital radiofrequency memory ("DRFM") has been utilized to digitize an incoming RF input signal at a frequency and bandwidth necessary to adequately represent the signal and then to reconstruct that RF signal when required.

A typical DRFM system converts an incoming signal to a digital stream of data which is then phase corrected and stored digitally to be played back when needed. However the DRFM has multiple issues which preclude a simple design. Moreover DRFMs are speed limited and dynamic range limited and are not optimized for size, weight and power.

It will be appreciated that the ability to sample an incoming RF signal and to be able to reproduce it at a later time has a major application in the provision of countermeasure signals which alter the modulation or some other parameter of the incoming signal in such a way as to be able to spoof or countermeasure for instance incoming missiles which can be caused to veer off course. Additionally, the ability to take an original RF signal and to be able to modify it to provide misinformation is indeed useful in various asymmetric warfare situations. Further, the ability to detect an incoming RF signal and to duplicate the signal for analog use thereafter has application in all manner of communications given the ability to faithfully reproduce and use the original RF signal.

Typical digital radio frequency memories occupy a large amount of space in a rack aboard an aircraft which occupy laterally a number of feet, and height wise the same. The amount of power necessary is primarily associated with the powering of analog-to-digital converters, memories and digital-to-analog converters in which the RF signal is not only stored but is phase corrected so as to be able to faithfully reproduce the incoming signal. Were it possible to eliminate the analog-to-digital conversion stage as charge well as the digital-to-analog conversion stage, a large amount of equipment could be dispensed with. This also applies to the elimination of serial to parallel converters and phase correction as charge well as a sampling oscillator.

Thus, a simple storage device that can faithfully store and reproduce an incoming RF signal would be of great advantage. This is especially true in applications where space and power is limited such as for instance in drones. There is therefore a need for an RF memory system that can provide simplicity of design, speed, and dynamic range and can reduce device weight, size and power as compared to the present digital radio frequency memory systems.

Referring now to FIG. 1, a digital radio frequency memory, DRFM, shown at 10 is designed to digitize an incoming RF signal 12 at a frequency and bandwidth necessary to adequately represent the signal and then reconstruct the RF signal at an RF output terminal 14 of the device. The DRFM of FIG. 1 converts the RF signal to a digital stream of data which is phase corrected and stored digitally to be played back when needed.

DRFM 10 includes a limiting amplifier 16 the output of which is coupled to a quadrature IF mixer 18 and thence to low pass filters 20 which output to an analog-to-digital converter 22, the output of which is coupled to a memory subassembly 24. The memory subassembly 24 includes a memory 26 operably coupled to parallel/digital and parallel/serial converters 28 that are clocked by a phase correction circuit 30 driven by a sample oscillator 32. This circuit provides phase correction 34 and clock signals 36 to converters 28. The output of the phase correction circuit 30 is applied to an RF output subassembly 40A that includes a digital-to-analog converter 42A, low pass filters 44, a single sideband modulator 46, amplifier switch 48 and an output port 50 from which is derived an appropriately modulated replica of the incoming RF signal 12. Memory subassembly 24 is controlled by control subassembly 52 that includes a main control 54 and addresses the generation unit 56, a control interface 58 and a voltage regulator 60 which completes a digital radio frequency memory system.

The DRFM is an electronic method for digitally capturing and retransmitting RF signal. DRFMs are typically used in radar jamming, although applications in cellular communications are becoming more common. A DRFM system is designed to digitize an incoming RF input signal at a frequency and bandwidth necessary to adequately represent the signal, and then reconstruct that RF signal when required. The most significant aspect of DRFM is that as a digital "duplicate" of the received signal, it is coherent with the source of the received signal. As opposed to analog 'memory loops', there is no signal degradation caused by continuously cycling the energy through a front-end amplifier which allows for greater range errors for reactive jamming and allows for predictive jamming. A DRFM may modify the signal prior to retransmitting which can alter the signature of the false target; adjusting its apparent radar cross section, range, velocity, and angle. DRFMs present a significant obstacle for radar sensors.

SUMMARY OF THE DISCLOSURE

Embodiments of the present disclosure provide a system and method for processing a signal in the RF environment In this regard, one embodiment of such a method, among others, can be broadly summarized by the following steps: using an Analog Radio Frequency Memory (ARFM) to store an analog amplitude representation of the signal in the form of elemental charge packets; and playing back the stored signal by converting the elemental charge packets back to their representative voltages to rejuvenate an original signal.

The present disclosure can also be viewed as providing a system for storing and outputting a replica of a radio frequency signal. Briefly described, in architecture, one embodiment of the system, among others, can be implemented as follows. A CCD element is used as the storage element, wherein a signal is input into the CCD element and moved through the CCD element at an ultra-high transfer rate, wherein the signal is transformed into a lowered transfer rate relative to a ultra-high transfer rate of the signal at input into the CCD element. A recovery system receives the lowered transfer rate signal, wherein the recovery system recovers the signal from the lowered transfer rate signal to the ultra-high transfer rate.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

These and other features of the subject disclosure will be better understood in connection with the detailed description in conjunction with the drawings of which:

FIG. 3 is a diagrammatic illustration of an Input CCD Memory Structure (active CCD array) illustrating the grouping of CCD elements in groups of four in terms of charge well content;

FIG. 4 is a diagrammatic illustration of the Input CCD Memory Structure of FIG. 3, illustrating that all the input CCD charge well content is populated to 80% of the charge well data, in which most of the charge that previously existed in the charge wells to the left, i.e. 80%, has now moved to the charge wells to the right;

FIG. 5 is a diagrammatic illustration of the input CCD memory structure of FIG. 4 illustrating the complete filling of the charge wells;

DETAILED DESCRIPTION

Figure 1:
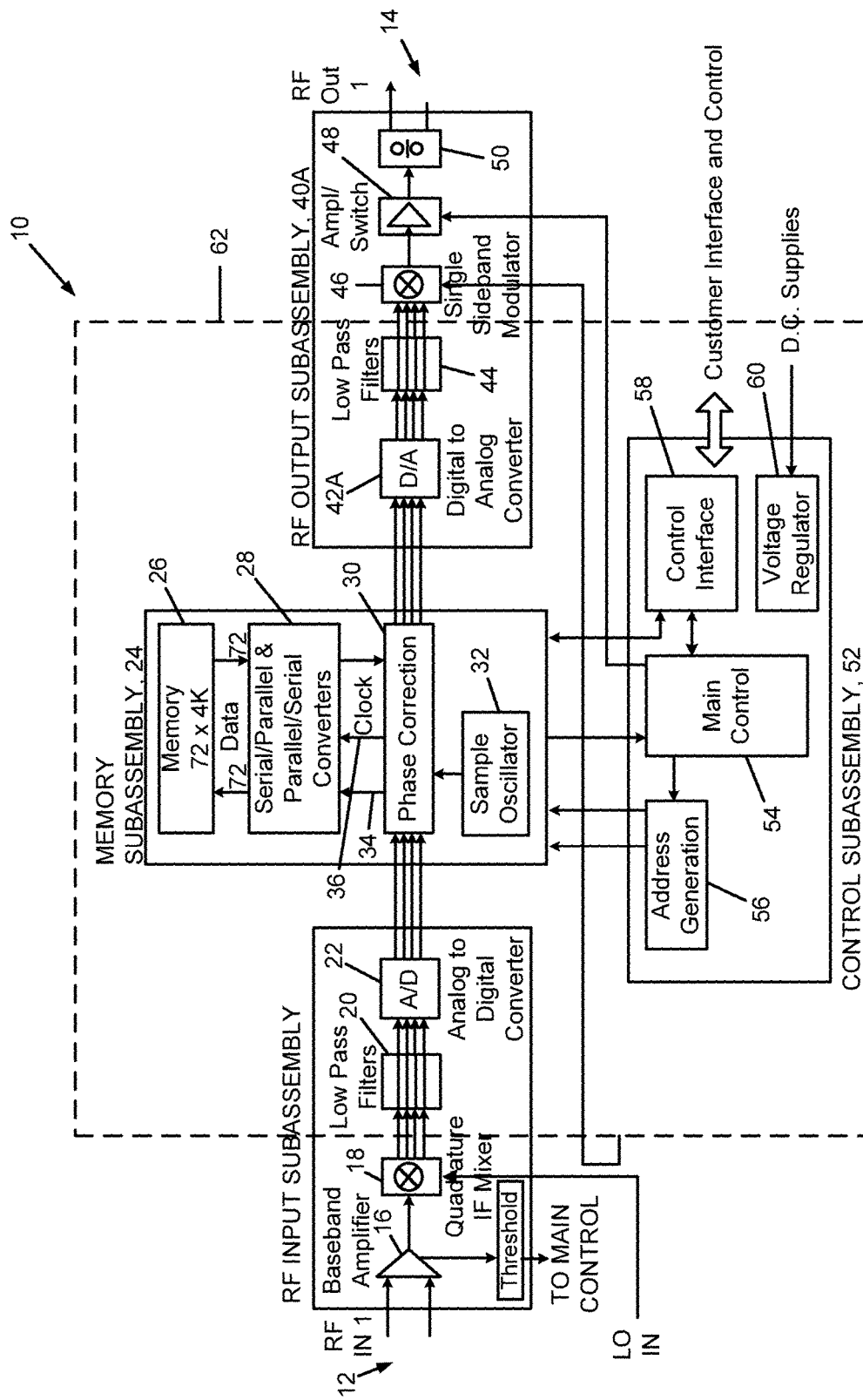
FIG. 1 is a block diagram of a prior art digital radio frequency memory system.

In order to provide a substitute for digital radio frequency memory systems, in the present disclosure a charged coupled device or CCD is used as the recording medium for incoming RF signals. The CCD is an analog system that avoids the use of digital techniques that include digital storage, analog-to-digital converters, digital-to-analog converters and specialized phasing and filtering.

The subject disclosure includes an analog radio frequency memory ("ARFM") which is a device used to store an analog amplitude representation of an incoming RF signal utilizing a charge coupled device (CCD). The ARFM, which may also be referred to as analog RF memory device, provides a low power and size limited alternative approach to the conventional DRFM, because it involves storage of an analog image of a RF signal environment in a CCD array. In essence the CCD is a shift register for the movement of electrical charge from one bin to the next. Signals are shifted between stages within the device often one bin at a time, but sometimes using a set or grouping of multiple bins at a time, as the electrons move between capacitive bins within the device.

The utilization of a charge coupled device permits one to reproduce the incoming analog signal as a reconstituted analog signal that circumvents the need for analog-to-digital converters, digital-to-analog converters, I/Q or in phase and quadrature hardware, serial to parallel or parallel to serial converters and phase correction hardware.

Rather, in the subject disclosure the RF signal is sampled with an ultrahigh rate strobe device so as to divide up the incoming signal into serial time segments that are injected into successive cells of a CCD array, called the Input CCD Memory Structure and functions as the active CCD array. The serial time segments may be relative based on replacement of conventional DRFM hardware, and may include serial picosecond segments, nanosecond segments, or another time segment. This may require an ultrafast CCD array with an ultrahigh charge transfer rate. These ultrahigh charge transfer rate CCD arrays are commercially available. At the bottom of the active CCD array is a Transfer Interface Structure that constitutes the main CCD array which functions as the interface between the main CCD array and the active CCD array.

In one embodiment the incoming signal is sampled and divided up into four segments comprising Input CCD Memory Structure. Each of these four segments is injected into a different cell of the CCD array. Each of the cells has associated with it a charge well. As is usual in charge transfer through CCD shift registers, charges from one of the charge wells is siphoned off or spilled into the next adjacent charge well, which is siphoned off into the next adjacent charge well at a rate commensurate with the acquisition of the incoming RF signal. In one embodiment a four-phase clocking scheme is used.

Thereafter, since the injected charge travels horizontally through the array and through a number of horizontal array elements, when the last of the Input CCD Memory Structure elements is finally filled up due to the charge transfer referred to above, each of these cell charge packets is siphoned off vertically and downwardly into the final row of the Input CCD Memory Structure (active CCD array) that constitutes the Transfer Interface Structure (main CCD array). This is the interface between the active CCD array and the main CCD array.

In operation, an RF signal is sampled using high-speed analog switching technology. The object is to save a representative sample of a selected RF environment in a large CCD array as an arrangement of charge pixels across the CCD array. This process involves sampling a selected portion of the RF's environment, converting each sampled voltage to its representative charge, conveying these charges to their final location within the CCD array, and utilizing a CCD transfer mechanism referred to as charge packet transfer that refers to the forward transfer of charge from one CCD charge well to the next forward charge well.

In one embodiment, there is a grouping of elements that comprise the input structure, for example, four elements in a group. The number of elements that comprise the input group is dependent on the CCD's charge transfer rate. The larger the number of elements comprising the CCD input memory structure, the more time that is available for the charge transfer mechanism. It will be appreciated that adjoined cells that encompass a group of CCD have space and time restrictions. This is why a grouping of at least four cells may be required, which allows the needed space and time for charges to properly migrate between the CCD elements, as described further herein.

In general, the sampled signals are injected into a CCD array where they travel horizontally through the array and can be read out after all the charge wells in all the cells have been populated to 100%. After the horizontal rows have been populated or filled with electrons corresponding to the sampled input signal, each of the rows can be dumped vertically into a main CCD array. When the main CCD array has been populated with the downward movement of the electrons from the various cells, the last row of that grouping can be read out through a charge amplifier so as to reproduce the original signal.

It is noted that the CCD array can be thought of as an assemblage of capacitors that stores charge in the form of numbers of electrons in each of the charge wells that comprise the cells of the CCD array. If after the desired RF environment capture is complete, it will then be used to replicate the original signal with additional modifications, such as delay, amplitude modifications, and other activities.

As will be described, in one embodiment, sampled signals are provided directly from the output of an immediate frequency (IF) stage. A sampler and track and hold circuit utilizes a set of four high-speed optically driven switches to sample the RF environment, namely the down-converted IF signal (which may be referred to herein as IF signal or baseband signal). Each of the four switches is closed and opened sequentially to sample the environment. Each sample of the IF signal is stored in a track and hold circuit for as long as it takes to save an analog amplitude representation of the RF input signal, namely the image of that charge, into the one of the first four cells of the Input CCD Memory Structure, the active CCD array. For an implantation using a track-and-hold system, the sampling begins when the first input switch is enabled allowing a representative RF sample to be collected by the track-and-hold capacitor. Other sampling can be accomplished in a variety or other ways. With each step of the input switch a new sample is stored by the track and hold hardware as the charges move to its adjacent CCD cell. As charge data is collected it moves horizontally across the CCD charge well structure until the last cells in the grouping of cells that comprise the active CCD grouping contain 100% of their analog amplitude representations in the CCD charge wells in the CCD input group. For example, all of the four final cells would be filled 100% when four input selector switches are used, whereas all eight of the final cells would be 100% filled when eight input selector switches are used.

It is noted that the time for the last cells in the grouping within the CCD structure will be dependent on the number of input selector switches. The time for filling of the final cells will be offset by one time period based on a cycle of the total time it takes to fill the last cells. For example, with a four input switch implementation, the fourth cell for the first selector switch will have a final charge in the fourth location.

After 100% of the CCD cells have been filled, the charges are directed to move vertically downward to a bottom row presently unfilled. This bottom row is the buffer row which acts as an interface between the active CCD array and the main CCD array.

At the conclusion of the vertical downward transfer, 100% of the point charges transfer out of the active CCD array and the charges have been moved into the main CCD array. Note that while charges are transferred vertically to the main CCD array, new group of charges have been entering into the active CCD array and subsequently transversely horizontally as the input loading process repeats. Loading new data and the storage happens concurrently in one embodiment filling the active CCD array and offloading it into the main CCD array which continues until the CCD array has stored the required amount of data.

Depending on how wide the active CCD array is and concomitantly how much time it takes to fill the active CCD array, this corresponds to the amount of time available for the main CCD array transfer time. This way a wide active CCD array allows the main CCD array data to be moved at a much slower pace than during the input sampling process. For example in an active CCD array of 16 cells in width, this allows nearly 16 times as much time for the main CCD array to dump the data to the next part of the main CCD array. To accomplish gigaHertz sampling rates and large data storage requires the use of relatively wide active CCD arrays, for example, perhaps 1,000 or 10,000 wide.

In one embodiment, the main CCD array has different properties with respect to the high transfer rate active CCD array. The difference between the main CCD array and the active CCD array is as follows. The active CCD array has an ultra-high charge transfer rate and uses a charge splitter steering process that allows redirection of the charges from horizontal to vertical. The main CCD array has a normal or high speed charge transfer rate.

As to charge storage, the active CCD array can be thought of in as an assemblage of capacitors that store charge in the form of a number of electrons in each of the charge wells that comprise the CCD array. In one embodiment, a charge image mirror array identical to the active CCD array is used to store an image of the charge pixel representation of the RF environment, with the charge pixel representation being stored in an area adjacent the active CCD charge well array. Strategic utilization of the charge image mirror allows the saved image to be moved in and out of the active CCD array so that it can be output or recirculated on cue as often required during the playback process.

During a recovery of the signal, the playback process involves the recirculation of the whole or part of the stored RF environment. The recovery system or CCD playback system recovers and either recirculates the RF environment in its present form or plays back selected contents of the charge image mirror. To play back the RF environments saved in the charge image mirror requires loading the active CCD array with selected charge image mirror data.

For the playback process to ensue, the stored RF environment which is now in the form of elemental charges in terms of packets must be converted back to the representative voltages. To accomplish the transition from charge to voltage involves the use of a charge amplifier, strategically located in several places throughout the CCD structure. These strategically located rows may appear similar to the interface buffer 94 which is located between the active CCD array and main CCD array. This use of multiple strategically-located rows for multiple buffering, i.e., writing in data and reading out data, what is often referred to in the art as 'ping pong', can be used. By proper phasing and sequencing of the voltages, the original RF signal can be reconstituted or rejuvenated.

What makes possible the high frequency sampling is a high speed sampler. With respect to the strobing circuits and more particularly to the ultrafast switches, the pulses that are utilized involve very narrow pulses in orders of picoseconds. These sampled signals are converted into representative charges that represent the virtually instantaneous sample part of the incoming RF signal. These charges are then injected into the first part of the CCD array. There are several ways to accomplish injecting and/or controlling the injection of charges into the active CCD. A laser can be used to drive a PC controlled switch as part of sample and hold function. Alternatively, a laser driven by a linearity compensation driver which has been modulated by the input signal can be used. In another alternative, a ring modulator sampler can be used to drive track and hold devices.

The high speed sampler can take the form of a ring sampler, the output of which is divided, for instance, into four segments, each having a track and hold circuit. This high-speed sampling circuit in one embodiment is a semiconductor switch sampler such as a bipolar or FET-based sampler with the output of the individual track and hold circuits being injected into four different horizontally arranged rows of elements in the corresponding active CCD array. One of the implementations may embody a ring sampler as part of an optically laser-driven PC controlled switch such as available in indium phosphide or gallium arsenide to provide photoconductive sampling.

Alternatively, the high speed sampler may involve the use of a laser diode which can be steered to inject energy into CCD photodiodes utilized to inject electrons into the aforementioned horizontally running four rows of CCD elements. In this situation, the signal itself is impressed upon the laser directly, which is impressed on the CCD elements photometrically. In one embodiment the high-speed sampling includes the aforementioned track and hold circuits which may be either semiconductor samplers or optical driven photoconductive samplers followed by a clocked CCD virtual sampling circuit.

Further, the CCD memory gives the system a wide dynamic range that digital versions do not achieve. In short the digital memories cannot define signals very precisely, i.e., without a great loss of size, weight, and power (SWAP). However charge coupled devices, when operated as described above, provide many advantages over the digital systems in addition to reducing SWAP. This makes these systems fieldable in very small packages for use in space limited applications such as drones.

Note that the subject system varies from the DRFM systems which take a signal and basically collect the signal and converted into a digital signal. These DRFM systems accomplish signal replication utilizing in-phase and quadrature signals from which an analog signal can be generated. However in so doing there are large errors that must be corrected.

On the other hand, the subject system maintains the original's signal as-is, and does not convert from one domain into another. Rather it samples the signals and stores them as charge packets in a CCD array with precise timing. Note the CCD array enables a very large storage of data with very large signal-to-noise ratios and with high resolution. The subject system thus achieves resolutions of fractions of a degree when replicating the original signal.

In short, the subject system samples incoming signal and stores its representative amplitude away in a very deep CCD array and then reads out the sampled signals. It is noted that the presently available CCD arrays can store on the order of 100,000 electrons in each pixel of the CCD cell locations. Present CCD technology resolution is 10 electrons so that if one takes the ratio of 100,000 to 10, you have close to 80 dB of dynamic range.

With respect to the strobing circuits and more particularly to the ultrafast switches, the pulses that are utilized control, for instance, the laser type system which involves very narrow pulses on the order of picoseconds. These sampled signals are converted into representative sampled charges that represent the virtually instantaneous sampled part of the incoming RF signal. These charges are then injected into the first part of the CCD array. How these charges are injected either through electronic or optical means will be discussed hereinafter.

Figure 2A:
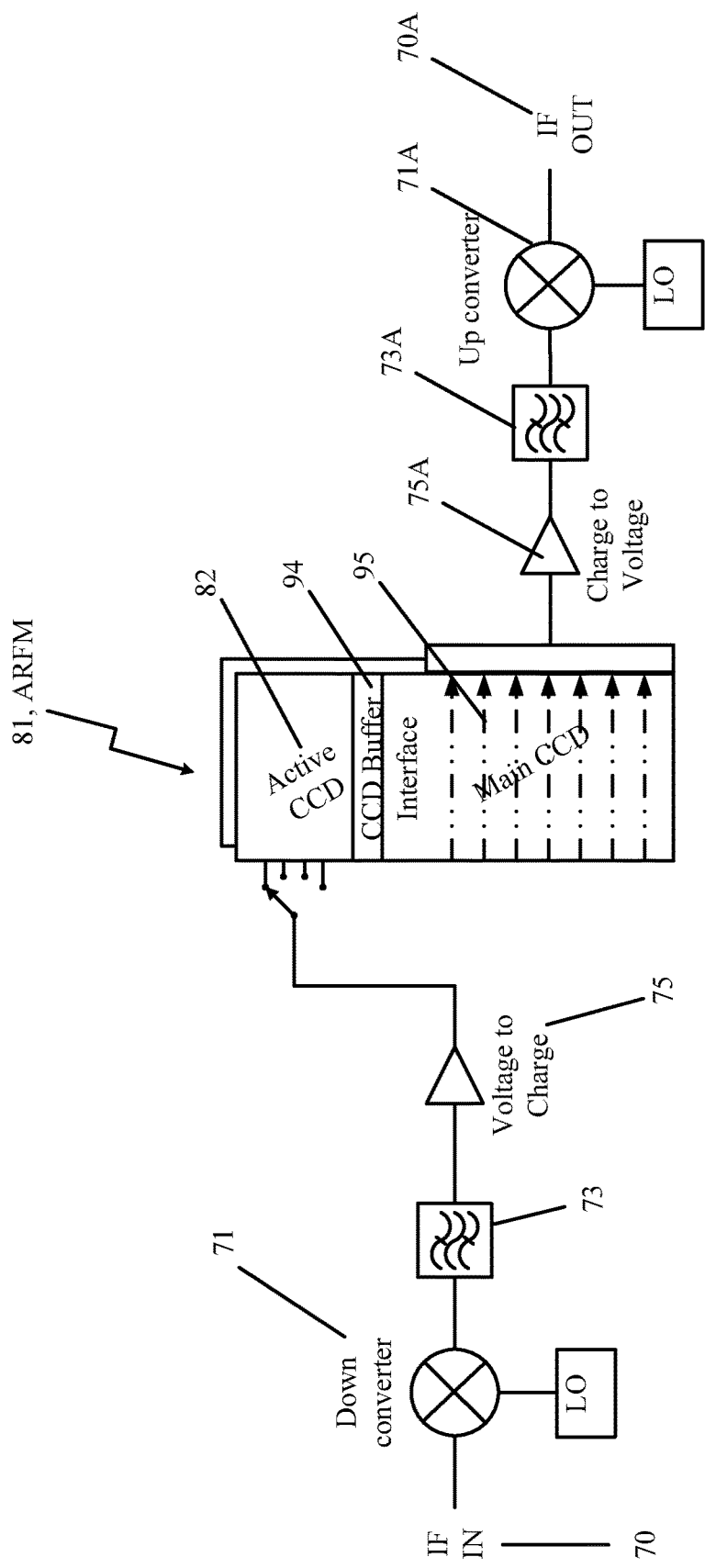
FIG. 2A is a block diagram illustration of an analog radio frequency memory (ARFM) utilizing a charge coupled device array with incoming RF signals.

FIG. 2A is a block diagram illustration of an ARFM utilizing a CCD array with incoming RF signals. As is shown, the ARFM 81 is designed to sample the input signal at a rate to meet the signal Nyquist criterion so that the resulting assemblage of stored analog data replicates the RF input signal. To accomplish this, the incoming IF signal 70 is down converted by a double balanced mixer 71 followed by filtering device 73. A ring sampler with the double balanced mixer 71 may be used to incrementally select portions of the data within the IF signal 70. That data is converted to charge equivalent packets using the voltage-to-charge converter 75, and the packets are then stored in the charge wells of the active CCD array 82, which comprise the CCD memory. That data is then moved through the CCD buffer interface 94 and finds its way into the Main CCD array 95. After data collection is complete an exact image of that data is recorded for later use. Any or all of data image can be recalled so that the RF signal is reconstructed when required.

Relative to FIG. 2A, the steps in the ARFM storage process may include: selective sampling of data; conversion of data from voltage to charge equivalent packet form; collecting the data in the high speed active CCD array 82; formatting the charge packets to be stored in the main CCD array 95 using the active/main CCD buffer interface 94; saving formatted charge packets in main CCD array 95; and copying main CCD charge packets to a charge mirror image array. During reconstruction, the steps in the ARFM playback process may include: copying selected charge packets from the charge mirror image array back to the main CCD array 95; within the main CCD 95, moving the charge packets into place for replay (indicated by the dashed areas); sweeping out the data horizontally toward the charge to voltage converter 75A; and filtering 73A and up-converting 71A the signal, in which the ARFM system may modify the signal 70A prior to retransmitting which can alter the signature of the false target; adjusting its apparent radar cross section, range, velocity, and angle.

Figure 2B:
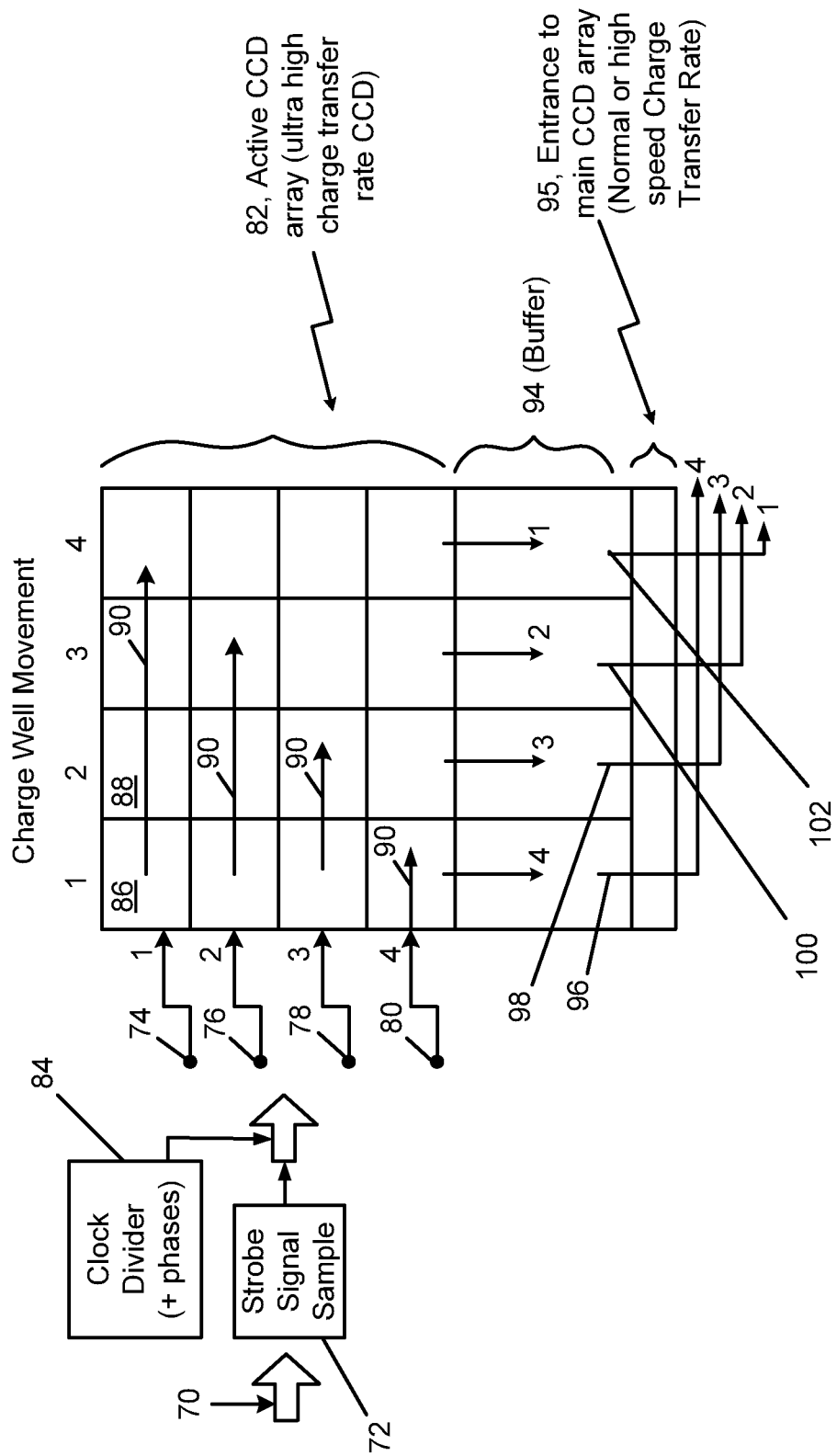
FIG. 2B is a diagrammatic illustration of an analog radio frequency memory utilizing a charge coupled device array in which incoming RF signals are sampled and injected into various charge wells corresponding to CCD elements, showing the horizontal charge transfer as charge well as a vertical transfer when all charge wells are 100% populated with electrons.

FIG. 2B is a diagrammatic illustration of an analog radio frequency memory utilizing a charge coupled device array in which incoming RF signals are sampled and injected into various charge wells corresponding to CCD elements, showing the horizontal charge transfer as charge well as a vertical transfer when all charge wells are 100% populated with electrons. Referring to FIG. 2B, it is a purpose of the subject system to completely eliminate those elements shown in dotted outline 62 of FIG. 1 and replace the memory subassembly with the subject CCD system. It will be seen that if all of the elements in dotted box 62 are removed, analog-to-digital converters, digital-to-analog converters, phase correction circuits, and serial/parallel and parallel/serial converters are eliminated as well as the memory for the subassembly.

Assuming that the IF of a receiver is available and that this signal is available at 70, a strobe signal sampler 72 is used to sample the signals into segments and provide the sampled voltages to switch contacts 74, 76, 78 and 80 so as to be able to inject the signal into cells 1, 2, 3 and 4 of the active CCD matrix 82, so as to populate the associated charge wells with electrons, the readout of which is used to reconstitute the incoming signal. The strobe signal sample 72 is driven in one embodiment by a clock divider 84 that permits dividing up the incoming signal into four phases corresponding to the four charge well elements which are utilized to capture and store the incoming signal.

The process of dividing up charge elements is needed since the time of the active CCD storage process is limited and the use of a ring sampler/clock divider 84 that allows the track and hold circuit to quiesce is requisite. This is explained as follows:

Note, in the illustrated embodiment the track and hold function involves a strobing element such as a PC switch or other device that provides a sampling function. Here, there are in essence four track and hold circuits so that the track and hold process is not held up by the charging time for the filling of a charge well.

As will be appreciated, the track and hold circuit functions as a sample and hold circuit. Every sample and hold circuit needs some time to quiesce, until the next event in the track and hold occurs. In the acquisition phase, which is equivalent to the inverse of the number of switch elements present, i.e., 1/(number of switch element present), the data is impressed on the capacitor, and that data remains there for the period of time represented by the number of switch elements present.

The recovery process should be as sharp and jitter free as possible and one can define the sampling process by an aperture function over time. It takes time to transfer the captured sampled voltage, saved on the track and hold capacitor, to the charge well. Note that the track and hold circuit contains a buffer amplifier to isolate the CCD charge injector from the track and hold capacitor. Since it takes time to transfer the charge to the CCD charge well via the CCD charge injection process, the track and hold circuit will not be ready to collect the next charge sample for a period of time. Thus, the filling time of a charge well in the CCD dictates how long the track and hold circuit quiesces, i.e., waits the proper amount of time for the charge well transfer to the active CCD to be complete. To keep the process moving, a second track and hold circuit, for example, is enabled while the first track and hold circuit is quiescing. This second track and hold circuit is feeding a different charge well along a different horizontal line. Then, a third track and hold circuit, for example, is enabled while the first and second track and hold circuits are quiescing. Finally, a fourth track and hold circuit is enabled while the previous three track and hold circuits are quiescing.

Once the fourth track and hold circuit is completed, the first track and hold circuit is then re-enabled to begin the process again. This process allows a different charge well to be utilized sequentially so that the process is not held up by the charge rate of another charge well. In the illustrated embodiment the equivalent of four track and hold circuits are used, and therefore it will take 4 cycles for the process to repeat itself. Note that with the ultra-high charge transfer rate for the active CCD, the track and hold circuit can nonetheless sample in the picosecond time frame.

As will be appreciated, the shift register style CCD devices move a charge from one charge well, for example, charge well 86 at switch 74 and column 1, to another charge well. The movement of the charge horizontally, as illustrated by arrow 90, eventually fills charge well 88, located a switch 74 and column 2. The horizontal movement is due to the charge packet transfer that describes a forward transfer of charge from one CCD charge well to the next forward charge well. Strobing of the signal for consecutive segments transfers different slices of the incoming signal into different charge wells corresponding to four different rows so as to populate all of the charge wells in this grouping of four charge wells in one embodiment.

When all of the charge wells of the last column of the active CCD array 82 associated with each switch have been filled, e.g., column 4 for switch 1, column 3 for switch 2, column 2 for switch 3, and column 1 for switch 4, the charges are transferred to the buffer 94 and stored there momentarily and the process of moving the elements vertically down into the main CCD array 95 can begin. The charges are dumped as illustrated by arrows to a buffer 94 (also referred to as a Transfer Interface Structure), the interface between the active CCD array 82 and the main CCD array 95. Once the active CCD array 82 is filled, at 100% of all charges, they eventually move to the buffer 94 (transfer interface structure). In one embodiment of the active CCD array 82, if the CCD charge well is defined as having a width of N, the active CCD array moves at N*times the amount of time to move the charge packet vertically. The result is that upon dumping the electrons in the charge wells, as illustrated by arrow 96, the electrons in charge well 1 of the active CCD array move to the main CCD array 95. This is followed by the dumping of the electrons in charge well 2, as illustrated by arrow 98, the dumping of charge well 3, as illustrated by arrow 100, and the dumping of charge well 4, as illustrated by arrow 102. When these charges are dumped into the main CCD array 95, they are available in the order 1, 2, 3, 4. When coupled out to a charge amplifier the voltages associated with these are likewise 1, 2, 3, and 4. This process reestablishes the replica signal to be comparable to the sampled input signal 70 as illustrated.

For clarity in disclosure, an exemplary number of switches and charge wells are utilized to describe movement of the charges throughout the arrays. In particular, four switches and 16 charge wells are depicted in FIGS. 3-6B. However, it is noted that any number of switches and charge wells may be used with the same process. In fact, it may be useful for thousands or tens-of-thousands of charge wells with a large number of switches to be used in some applications.

FIG. 3 is a diagrammatic illustration of an Input CCD Memory Structure (active CCD array) illustrating the grouping of CCD elements in groups of four in terms of charge well content. Group number one corresponds to charge wells 1, 2, 3 and 4, whereas group number two corresponds to charge wells 5, 6, 7, 8, followed by group number three corresponding to charge wells 9, 10, 11 and 12, followed finally by group four corresponding to charge wells 13, 14, 15 and 16.

Input selector switch 110, in this embodiment, consists of a track and hold and charge injector which samples the input signal to provide injected energy into charge well 1, with charge well 1 indicating that it is only 10% filled. Note the process is such that in this embodiment, the track and hold function involves a strobing element such as a PC switch or other device that provides a sampling function. Here the sample and hold function is embodied in the track and hold function of the track and hold circuit.

With each step of the input switch a new sample is stored by the track and hold hardware as the charge is moved to its adjacent CCD cell. As charge data is collected it moves horizontally across the CCD charge well structure, until the final cell for the group of charge wells corresponding to the switch contain 100% of their analog amplitude representations in CCD charge wells in the CCD input group. FIG. 4 is a diagrammatic illustration of the Input CCD Memory Structure of FIG. 3, illustrating that all the input CCD charge well content is populated to 80% of the charge well data, in which most of the charge that previously existed in the charge wells to the left, i.e. 80%, has now moved to the charge wells to the right. The active CCD array 82 shows that with input selector switch 110 having traversed by the number four position, the rows are populated to 80% capacity given the charge transfer functions within the active CCD array 82. In other words, 80% of the charges have been moved to the final CCD locations with 20% yet to be moved into the adjoining cells to complete the total move. This arrangement is achieved by each charge for a particular switch being moved horizontally across the active CCD array 82, e.g., from charge well 1 to charge well 16.

FIG. 5 is a diagrammatic illustration of the input CCD memory structure of FIG. 4 illustrating the complete filling of the charge wells. While in FIG. 4, 80% of the charges have been transferred to the appropriate charge wells, in FIG. 5 with switch 110 now having switched back to position one, the charge wells of the active CCD array 82 are filled to 100%, with the '1's indicating that the charge wells are filled. Thus, eventually, a charge would occupy one charge well in each of the locations diagonally from Selector switch 1-4 down to selector switch 4-1. The other wells (the wells to the left of the filled wells) would be unoccupied and thus be designated with a '0' within the charge well. The result is a complete filling of the four-way grouping. After this filling occurs, the charges can be moved to buffer 94.

Figure 6:
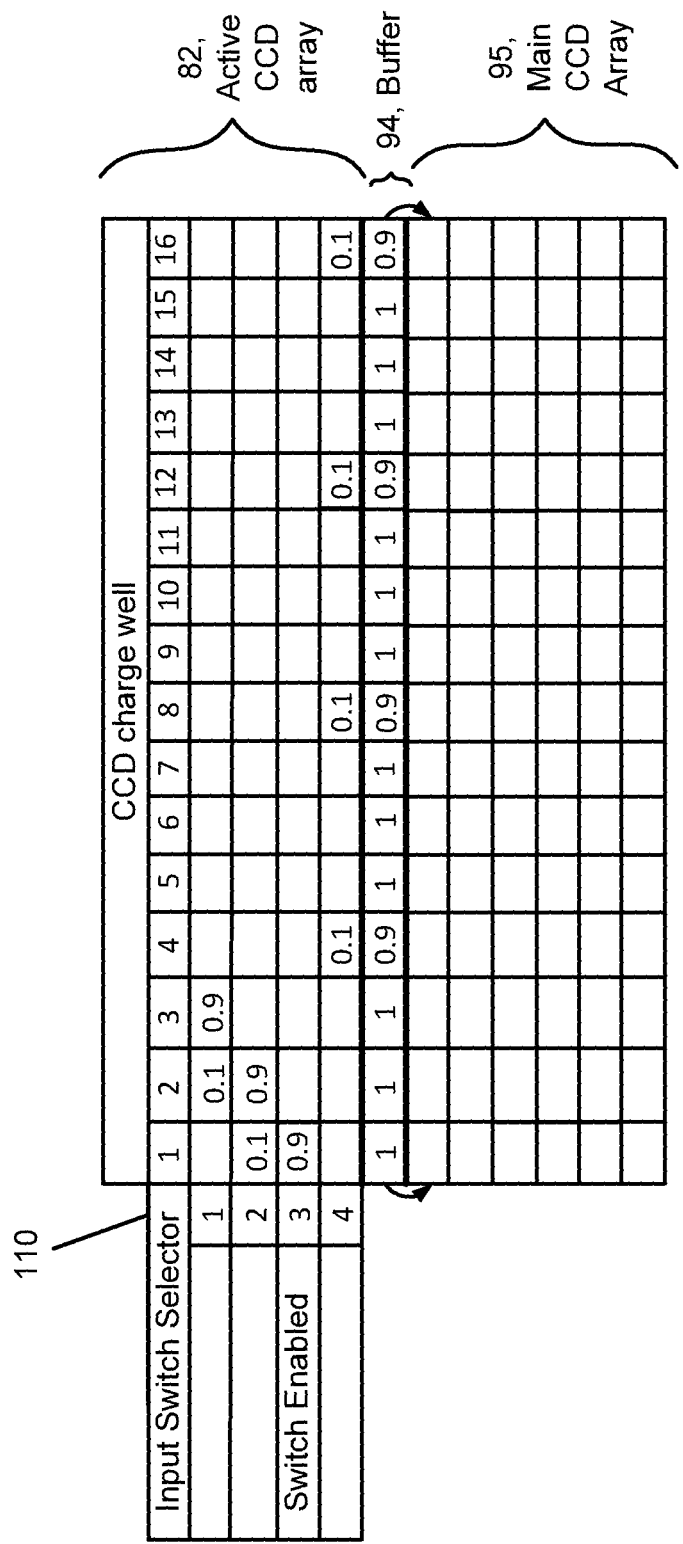
FIG. 6 is a diagrammatic illustration of the input CCD memory structure of FIG. 5, illustrating that the charges of the filled buffer row are transferred to the first row of the main CCD, to be able to read out the contents of the CCD memory.

FIG. 6 is a diagrammatic illustration of the input CCD memory structure of FIG. 5, illustrating that the charges of the filled buffer row are transferred to the first row of the main CCD, to be able to read out the contents of the CCD memory. As is shown in FIG. 6, the buffer 94 is nearly filled. Input selector switch 110 now rests on position three and may begin the filling of the CCD elements in the rows of the active CCD array 82, as soon as the contents of the rows of the active CCD array 82 have been dumped into the buffer 94. From the buffer 94, the contents may be then moved to the main CCD array 95 accordingly. As can be seen this is a cyclic process such that groups are not read out to the main CCD device until all of the elements of all the rows have been filled. When 100% of the CCD charge wells in the final positions within the active CCD array 82 have been filled, the charges are directed to move vertically downward to the buffer 94. This buffer 94 is the interface for transfer of charges between the active CCD array 82 and the main CCD array 95 via the first row of the main CCD array 95.

The illustration of FIG. 5 depicts a situation in time just prior to 100% filling of all the charge wells. As can be seen in FIG. 5, the buffer 94 is empty as charge packets are moving through the active CCD array 82. In comparison, in FIG. 6, the charges have almost fully filled the buffer 94 row, in that all but four of the exemplary 16 charge wells have achieved 100% filling and the four remaining charge wells have achieved a 90% fill. Once 100% filling in all 16 charge wells of the buffer 94 occurs, the charges may be transferred into the main CCD array 95, as indicated by the arrows from buffer 94 to the main CCD array 95. As a charge is syphoned off vertically downward into the buffer 94 row of the active CCD array 82, it is then transferred into a charge well of the main CCD array 95.

Eventually, the buffer 94 is filled at the point at which all of the elements and the input CCD memory structure have 100% of all the charges. The charges fill that one interface and transfer into interface function. The next period of time, which is equivalent to the time it takes to move across N cells, may be based on the N number of columns within array. The charges will move vertically downward into the main CCD array 95 and, a period of time later, charges will then move down to the next lower position and the previous other position will be filled with what has had now loaded into the transfer. The buffer 94 moves out at a rate of 1/N columns per period of time, N being the number of columns within the array.

As mentioned above, at the conclusion of the vertical downward transfer, 100% of the charge transfer out of the active CCD array is complete and the charge has been moved to the main CCD array 95. Note that while the charges are being transferred to the main CCD array 95, a new group of charges has been entering into the active CCD array 82 which subsequently transverse horizontally as the input loading process repeats. In this embodiment loading new data and storage of old data happens concurrently, with the filling of the active CCD array 82 and offloading it into the main CCD array 95 continuing until the main CCD array 95 has stored the required amount of data.

In the illustrated embodiment, the active CCD array 82 is 16 cells wide which allows nearly 16 times as much time to the main CCD array to dump data to the next part of the main CCD array as compared to a CCD array one cell wide. However, it will be appreciated that to accommodate Gigahertz sampling rates and the attendant large data storage, a considerably wider active CCD array is required.

Figure 7A:
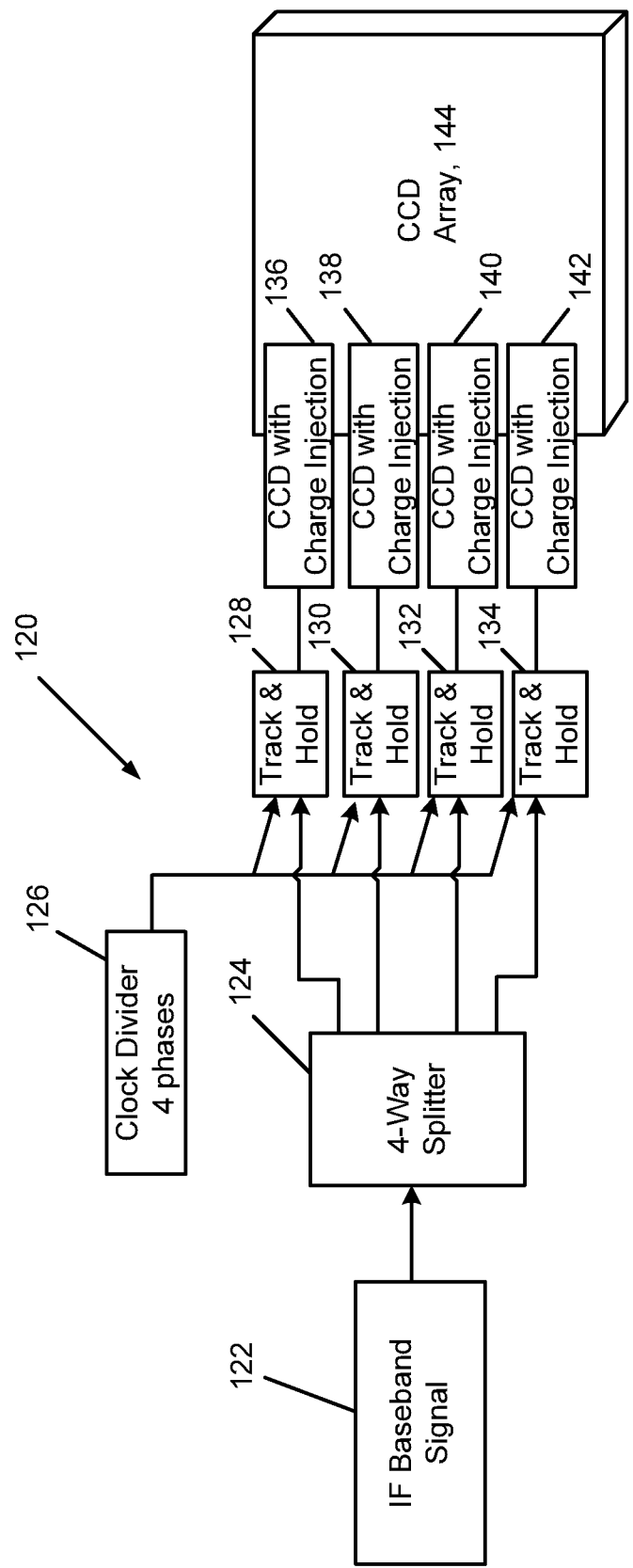
FIG. 7A is a block diagram of a ring sampler type strobing circuit in which the output of a four-way splitter containing the signal is sequentially sampled by four track-and-hold circuits driven by a clock divider whose outputs are injected into corresponding rows in the corresponding CCD array.

FIG. 7A is a block diagram of a ring sampler type strobing circuit in which the output of a four-way splitter containing the signal is sequentially sampled by four track-and-hold circuits driven by a clock divider whose outputs are injected into corresponding rows in the corresponding CCD array. The ring sampler 120 may sample the baseband signal 122 through the utilization of a ring sampler that is made up of a four-way splitter 124 which is under the control of a clock divider 126 that provides for phase samples of the incoming signal. The output of the ring sampler 124 is coupled to track and hold circuits 128 130 132 and 134. Note, the track and hold circuits are part of the ultrafast sampling system, the outputs of which are coupled to corresponding charge injection circuits 136 138 140 and 142 that inject the signals into the corresponding rows of the CCD array 144.

It is noted that the sampled signal is provided directly from the output of an IF stage of a receiver. The ring sampler track and hold circuits are driven by high speed optically driven switches to sample the RF environment, namely the aforementioned four switches. Each of the four switches is closed and opened sequentially sampling the environment. Each sample of the IF is stored in a track and hold circuit for as long as it takes to save an analog amplitude representation of the corresponding RF input signal or alternatively an image of that charge, into one of the four cells of the input structure for the CCD array 144. It will be noted that internal to the ring sampler 120 is a sequence of four switches that are sequentially activated to sample the IF input signal and apply it to the appropriate track and hold circuit.

Figure 7B:
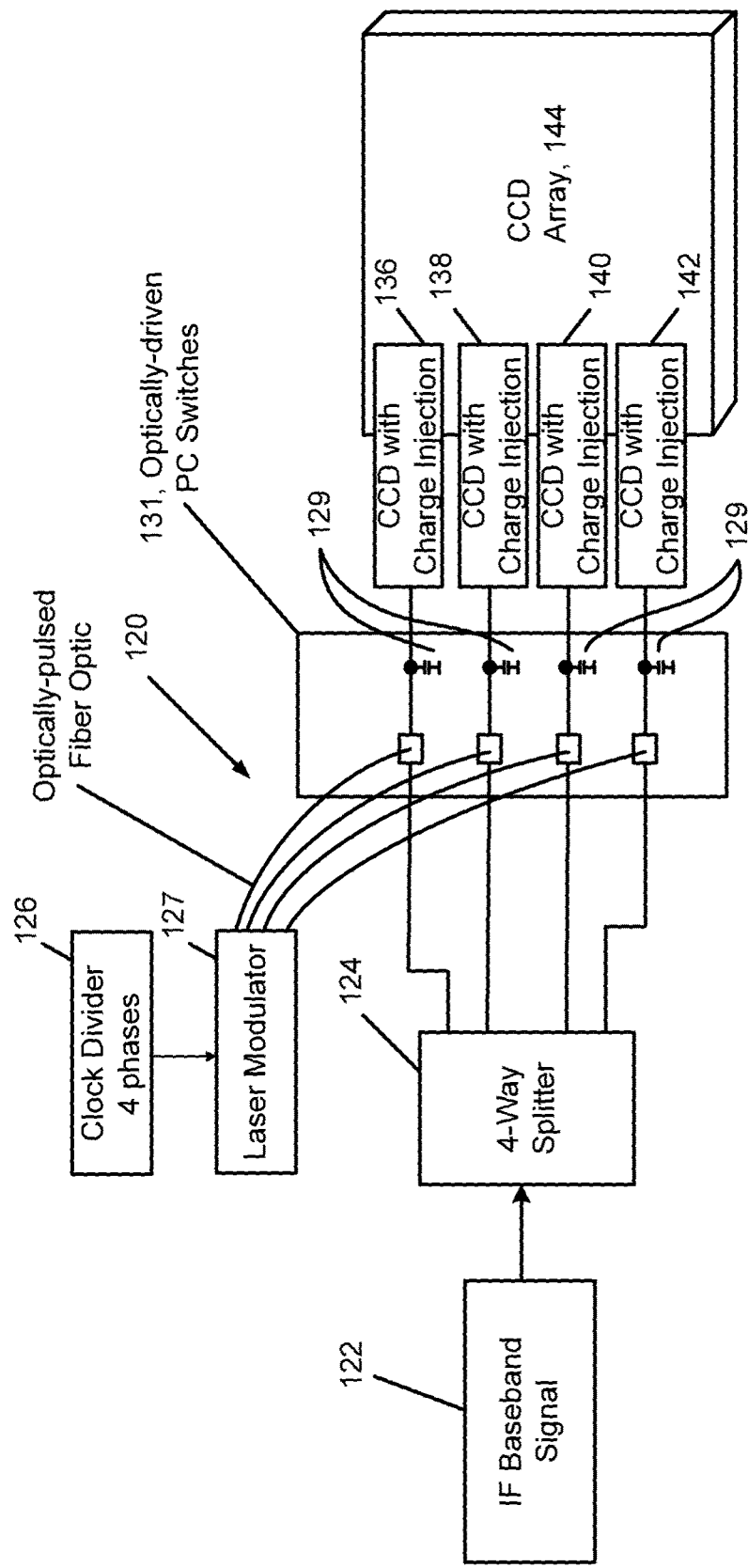
FIG. 7B is a block diagram of an optically-pulsed fiber optic arrangement type utilizing capacitors and optically driven PC switches to perform different track and hold functions whose representative charges are injected into corresponding rows in the corresponding CCD array.

FIG. 7B is a block diagram of an optically-pulsed fiber optic arrangement type utilizing capacitors and optically driven PC switches to perform different track and hold functions to be injected into corresponding rows in the corresponding CCD array. As shown, an IF baseband signal 122 is provided into a 4-way splitter 124. A clock divider 126 with 4 phases is connected to a laser modulator 127, which is a modulated laser signal that is driven by a laser driver. The modulated laser signal is used to create a pulse through fiber optic lines, e.g., to turn on a switch for that period of time and whatever the signal is at that instant in time at the four-way splitter 124, is then checked into the respective capacitor 129 which is part of the track and hold circuit within the optical-driven PC switches 131. The signal is held for a full turn at a time, e.g., for a whole nanosecond or another period of time, until the next time that the next signal comes, thereby providing ample time to keep that signal on that capacitor injected into the CCD array 144.

It is noted that the sampling and storage process is time consuming. Thus, it may be required for systems to include numerous switches and charge wells. For example, in one embodiment, the system may include four switches and many charge wells including those numbering in the thousands or more, and various numbers of switches can be used, four or eight or more switches, however a higher number or lower number of switches may be applicable in some operations. It is noted that the greater the number switches included, the more time that becomes available for the active CCD charge storage process to complete the transfer of charges within the active CCD.

Figure 8:
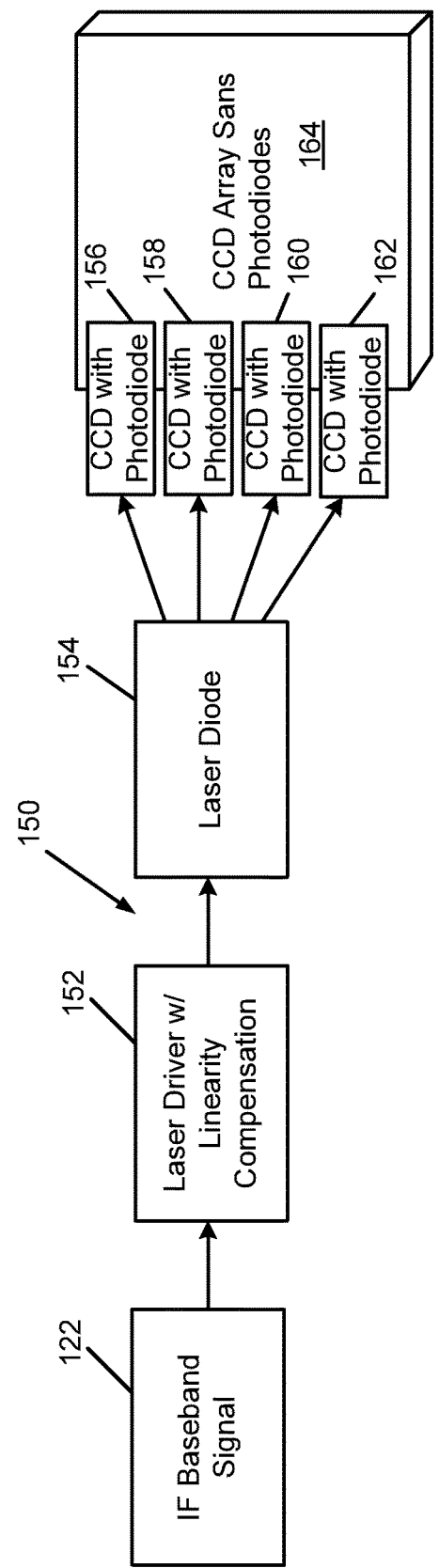
FIG. 8 is a block diagram of an optically driven charge injection system for strobing an input signal and using a laser diode steered to direct its output to one of four CCD photodiodes for the injection of the data into the corresponding rows of the CCD array.

FIG. 8 is a block diagram of an optically driven charge injection system for strobing an input signal and using a laser diode steered to direct its output to one of four CCD photodiodes for the injection of the data into the corresponding rows of the CCD array. As illustrated in FIG. 8, a laser driven sampling system 150 includes the provision of IF signal 122 to a laser driver 152 with linearity compensation which drives a laser diode 154 to whose output is steered to the respective CCD photodiodes 156 158 160 and 162 of CCD array 164. In this example, the laser diode 154 can be steered to inject energy into CCD photodiodes utilized to inject electrons into the aforementioned horizontally running four rows of CCD elements. In this situation, the signal itself is impressed upon the laser directly, which is impressed on the CCD elements photometrically. Note that the sampling systems of FIGS. 7A, 7B, and 8 have only the requirement that the sampling rate exceeds the Nyquist-Shannon criteria.

Figure 9:
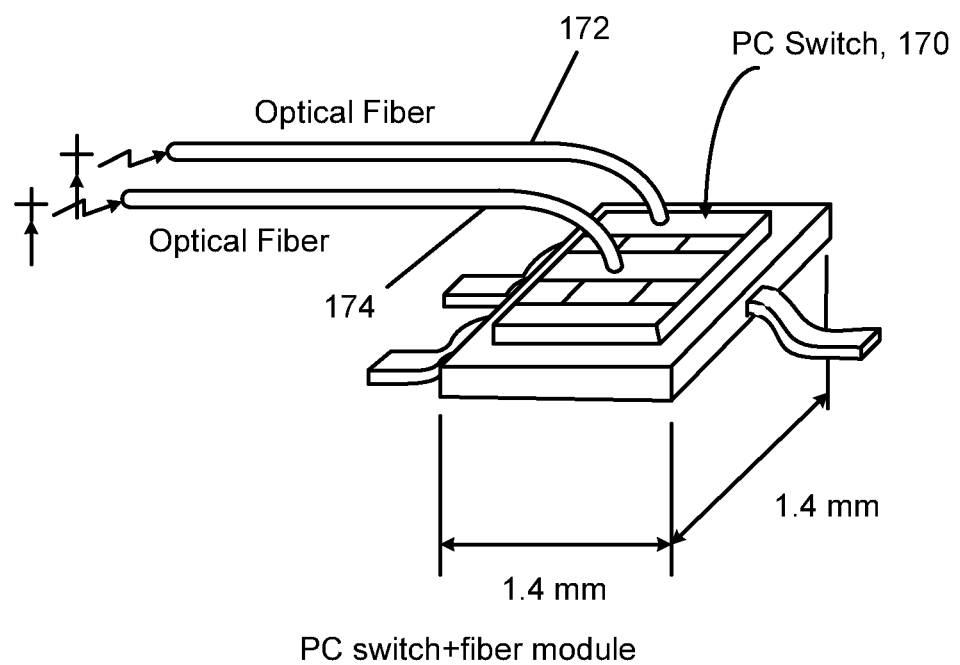
FIG. 9 is a diagrammatic illustration of a PC switch and fiber module for use in the switching circuits associated with FIG. 8 for obtaining picoseconds switching utilizing optical fiber inputs.

FIG. 9 is a diagrammatic illustration of a PC switch and fiber module for use in the switching circuits associated with FIG. 8 for obtaining picoseconds switching utilizing optical fiber inputs. As shown in FIG. 9, a PC switch 170 is fed by optical fibers 172 and 174 that are used for PC switching. The ring sampler track and hold circuit utilizes a set of four high speed optically driven switches to sample the RF environment, e.g., the baseband IF signal. Each of the four switches is closed and opened sequentially sampling the environment. Each sample of the IF Signal is stored in a track and hold circuit for as long as it takes to save an analog amplitude representation of the RF input signal, (image of that charge) into the one of the first of four cells of the CCD input structure. As described relative to FIG. 3, the sampling begins when the first input switch is enabled allowing a representative RF sample to be collected. It is noted that the diagrammatic illustration of the PC switch and fiber module of FIG. 10 may be incorporated when a laser is used as a trigger or optical sampler, wherein the laser acts to close the switch and allows the signal sample to be stored.

Figure 10:
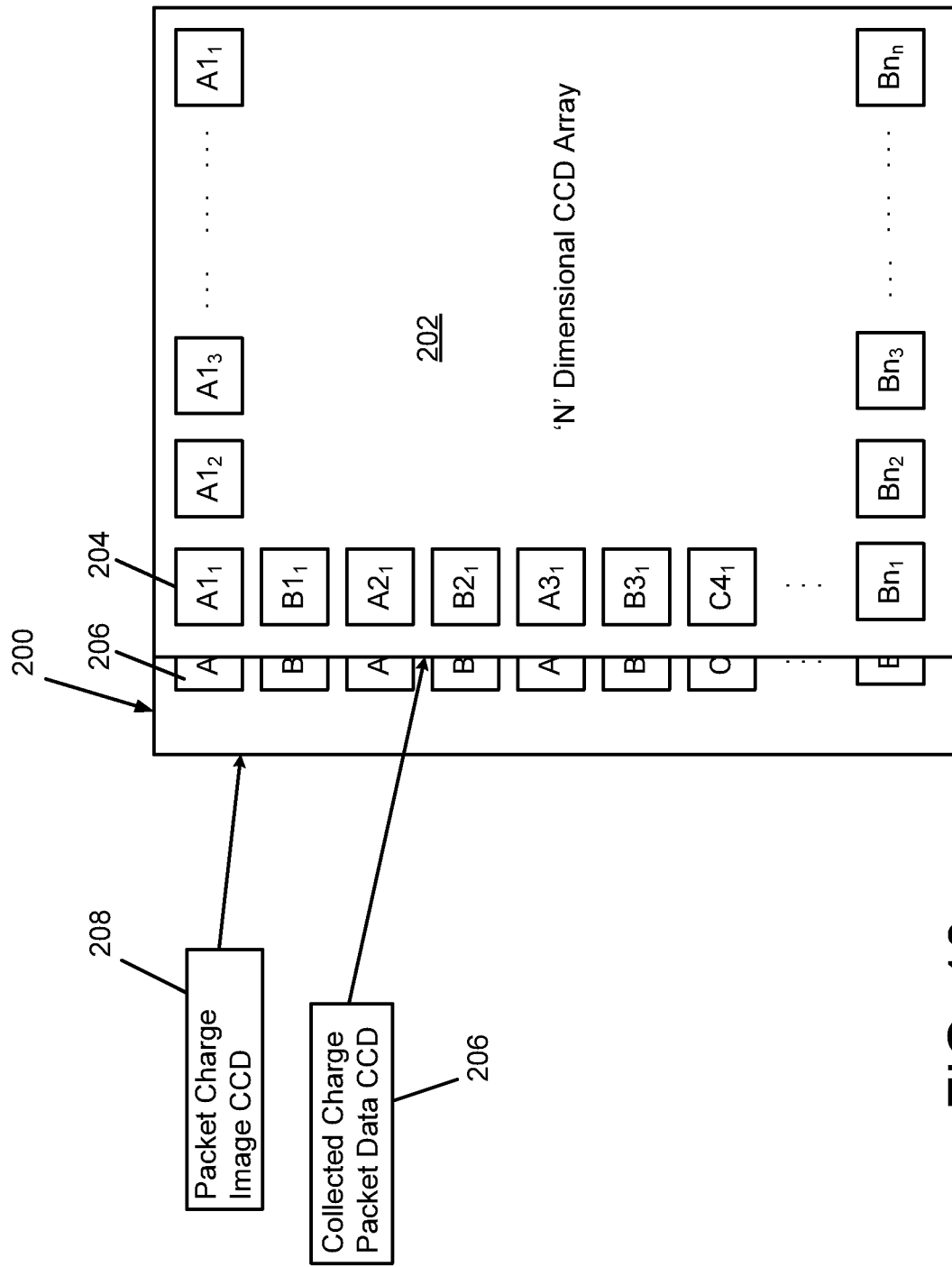
FIG. 10 is a diagrammatic illustration of the utilization of a charge image mirror CCD array in back of an adjacent to an active CCD array showing that the collected charge packet data in the active CCD array may be transferred to an identical element in the charge image CCD array; and, FIG. 11 is a block diagram illustrating charge injection of an original charge packet from an active CCD array to a mirror charge packet in a charge image mirror array.

FIG. 10 is a diagrammatic illustration of the utilization of a charge image mirror CCD array in back of an adjacent to an active CCD array showing that the collected charge packet data in the active CCD array may be transferred to an identical element in the charge image CCD array. FIG. 10 describes making a mirror image collection for later use, in which one array, for example the bottom or back array, is a mirror image of another array, for example the top or front array. With the placing of the image mirror CCD array 200 in back of the main CCD array 202, element for element, for instance elements 204 and 206, the elements may be coupled together so as to transfer the data in one cell in the active CCD array to a corresponding cell in the image mirror CCD array 200. Thus, the collected charge packet data, here illustrated at 206, is saved to cell 204 as part of the charge packet and may be transferred on demand to the image mirror CCD array 200 in terms of the packet charge image CCD data illustrated at 208. The active CCD data collection process should be completed before the packet charge image copy process can ensue. It will be appreciated that the image mirror CCD array 200 carries a charge image of the data in the active CCD array such that when this data is transferred to the image mirror CCD array 200 it can be stored and downloaded as described hereinbefore to a main CCD array so that an individual can pick and choose what portions are to be read out and reconstituted as an analog RF signal. The operation of the charge image mirror is shown in FIG. 11.

Figure 11:
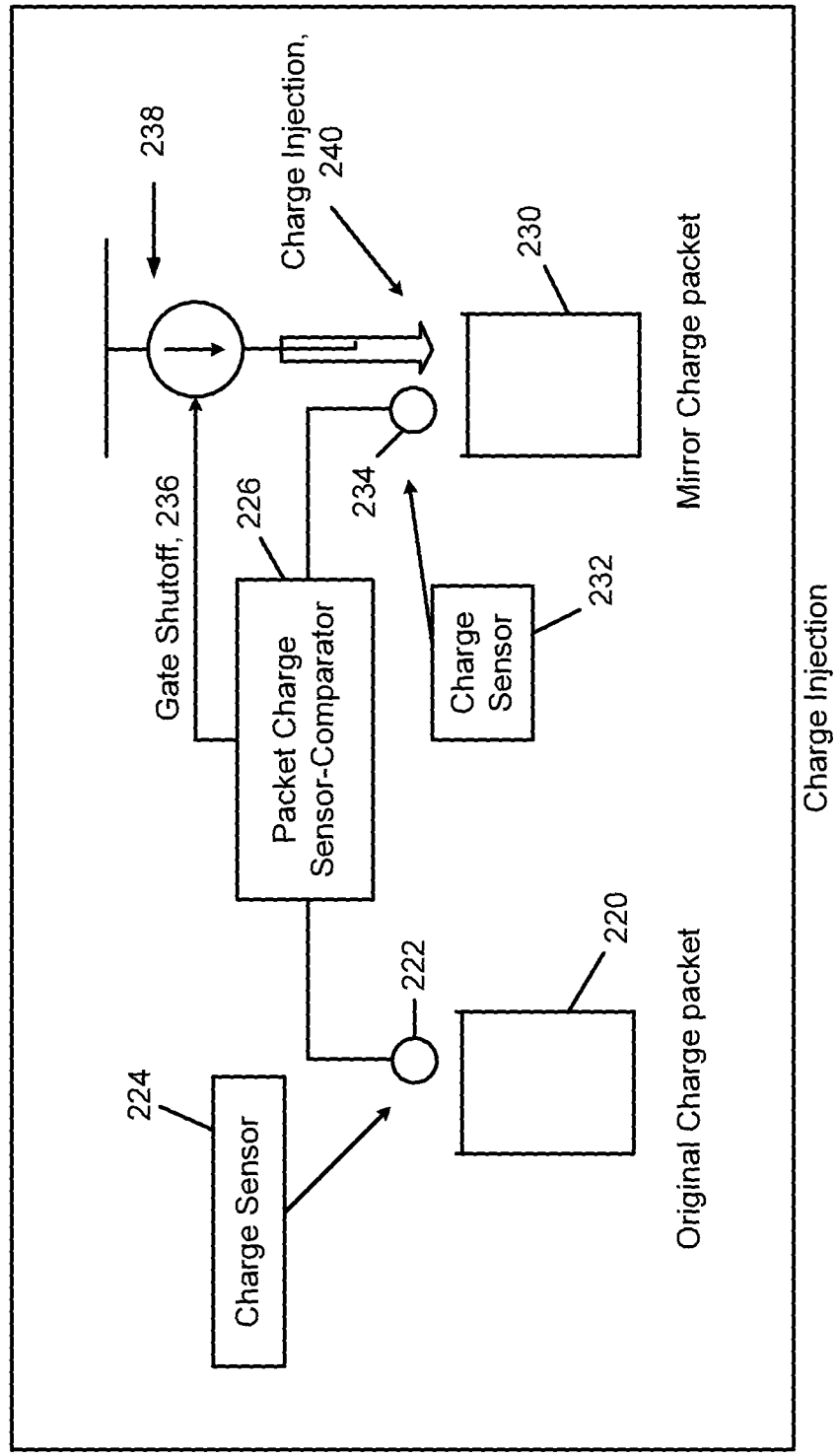

FIG. 11 is a block diagram illustrating charge injection of an original charge packet from an active CCD array to a mirror charge packet in a charge image mirror array. The original charge packet 220 may be read out in terms of electrons 222 by a charge sensor 224 into a packet charge sensor comparator 226 which is activated to initiate the charge mirror. The original charge packet 220 is to be transferred into a mirror charge packet 230 which has its own charge sensor 232 to sense the electrons 234 associated with the electrons in the mirror charge packet 230. The output from charge sensor 224 is compared with the electrons sensed by charge sensor 232 such that when the two are equal a gate shut off 236 shuts off a gate 238 to stop charge injection 240. In this manner the mirror charge packet is made to equal the original charge packet in terms of numbers of electrons. The result is that the packet charge image in the virtual image mirror CCD array will equal to the original charge in the active CCD array to which it is coupled.

The result is that the state of the active CCD array is duplicated by the charge mirror CCD array which can be downloaded and offloaded at will to select all or part of an incoming RF signal to be reconstituted.

A playback process of the reconstituted signal may involve the recirculation of the whole or part of a stored RF environment. For example, the CCD playback system may either recirculate the RF environment in its present form or plays back the selected contents of the Charge Image Mirror (CIM). To play back RF environment saved in the CIM requires loading the main CCD with the selected CIM data. For the playback process to ensure the stored RF environment which is now in the form of elemental charges packets must be converted back to their representative voltages. To accomplish the transition from charge to voltage involves the use of a charge amplifier. The playback process may require a set of strategically located high-speed buffer interfaces between the main CCD and a high speed CCD, similar to the high rate CCD that comprises the active CCD so that the data played back at the same rate at which it was collected. By properly phasing and sequencing of the voltages the original RF signal can be rejuvenated.

Additionally, as alternative functions of the system, the ARFM can be used for a multitude of functions that the DRFM provides including data processing, correlation and cross-correlation, receiver functions and a host of other analog based function processes at microwave rates. Besides the correlation and cross-correlation, the CIM can provide pipelining of data. Because the data can be stored linearly with time, and time of their occurrence is known, groups of related data can be retrieved from the pipeline on a timely basis as required. By playing back the data one can retrieve data in its original form without loss of fidelity as would be expected in a DRFM. In an alternative implementation a multiplicity of rejuvenated signals can be co-processed covering very wide bandwidths; any of the co-processed signals are of interest can be visited in whole or part by recovering them from the CIM. This can be accomplished by using parallel and compound processing of small primal elements of data recovered from the rejuvenated data streams. If after primal processing of small data elements look promising, these time marked data can be located in the pipeline; starting at the selected time data groups can then be processed virtually in real time. Correlation and cross-correlation functions can be accomplished within the CIM without the need to perform RF signal rejuvenation by simply performing correlation and cross-correlation within the CIM assemblage.

While the present disclosure has been described in connection with the preferred embodiments of the various figures, it is to be understood that other similar embodiments may be used or modifications or additions may be made to the described embodiment for performing the same function of the present disclosure without deviating therefrom. Therefore, the present disclosure should not be limited to any single embodiment, but rather construed in breadth and scope in accordance with the recitation of the appended claims.

What is claimed is:

1. A method for processing an original signal in the RF environment, the method comprising:
converting, via a voltage-to-charge converter, data of the original signal to elemental charge packets;
collecting the elemental charge packets in an input charge coupled device (CCD) array;
storing the elemental charge packets in a main CCD array;
copying the elemental charge packets from the main CCD array to a charge image mirror CCD array, such that the charge image mirror CCD array includes a charge image for the elemental charge packets in the input CCD array, thereby providing a stored signal; and
playing back the stored signal by copying the elemental charge packets from the charge image mirror CCD array back to the main CCD array, and converting the elemental charge packets from the main CCD array back to their representative voltages to rejuvenate the original signal.

2. The method of claim 1, wherein playing back the stored signal by converting the elemental charge packets back to their representative voltages to rejuvenate the original signal further comprises a charge amplifier for transitioning from charge to voltage.

3. The method of claim 1, wherein the original signal is inputted into at least one of a ring sampler and a power splitter, whereby the original signal is inputted to a plurality of track and hold memory devices and then to the input CCD array.

4. The method of claim 1, wherein the original signal is inputted to a laser driver with linearity compensation from which the original signal is inputted to a plurality of CCDs with photodiodes.

5. The method of claim 1, wherein said elemental charge packets are derived from a high speed sampling circuit coupled to said original signal.

6. The method of claim 5, wherein said high speed sampling circuit includes a ring sampler for injecting sequential samples of said original signal into selected cells within said input CCD array for populating selected cells within said input CCD array.

7. The method of claim 5, wherein said high speed sampling circuit includes a laser which is modulated by the original signal, wherein the laser has an output beam steered to a number of preselected positions corresponding to a number of photodiodes adapted to receive said steered laser beam for injecting selected cells within said input CCD array photometrically.

8. The method of claim 5, wherein said high speed sampling circuit includes an injector for populating selected cells within said input CCD array.

9. The method of claim 8, wherein said input CCD array includes an active CCD array with a number of rows of said cells and wherein said injector populates cells in different rows in said active CCD array corresponding to different sequential samples of said original signal.

10. The method of claim 9, wherein when all of the cells in the rows of said active CCD array have been populated, data from all of the populated cells is transferred to a row in said main CCD array.

11. The method of claim 10, wherein said playback includes reading out a selection of rows in a selected sequence of said main CCD array to a charge converting amplifier for outputting a replica of said original signal.

12. The method of claim 1, wherein said charge image mirror CCD array is for providing a virtual image of said input CCD array, and the virtual image is a charge pixel representation of the RF environment.

13. The method of claim 1, wherein playing back the stored signal includes moving charge data from said charge image mirror CCD array to said main CCD array for selective readout of said charge data for the formation of a replica signal incorporating only selected portions of said original signal.

14. A system for storing and outputting a replica of a radio frequency signal, the system comprising:
   a voltage-to-charge converter for converting data of the radio frequency signal to elemental charge packets;
   an input charge coupled device (CCD) array for collecting the elemental charge packets;
   a main CCD array for storing the elemental charge packets;
   a charge image mirror CCD array for storing a copy of the elemental charge packets stored in the main CCD array, thereby providing a stored signal; and
   a recovery system for playing back the stored signal by copying the elemental charge packets from the charge image mirror CCD array back to the main CCD array, and converting the elemental charge packets from the main CCD array back to their representative voltages to rejuvenate the original signal.

15. The system of claim 14, wherein said input CCD array includes rows of cells and further includes a high speed sampler for sampling said radio frequency signal and populating cells in selected rows of said input CCD array.

16. The system of claim 15, wherein said high speed sampler segments said radio frequency signal into a number of segments, wherein sequential segments populate cells in different rows of said input CCD array, wherein sufficient time is provided to populate the input CCD array during the charge injection and input CCD array data collection time.

17. The system of claim 16, wherein the data in all cells of said input CCD array, when filled, is transferred to said main CCD array for rejuvenation of said radio frequency signal.

18. The system of claim 14, wherein said input CCD array is characterized by a high charge transfer rate and wherein said main CCD array is characterized by a charge transfer rate that is lower than the high charge transfer rate.

* * * * *